April 23, 1968 G. P. ZENNER 3,378,915

METHOD OF MAKING A PLANAR DIFFUSED SEMICONDUCTOR
VOLTAGE REFERENCE DIODE
Filed March 31, 1966

INVENTOR
GERHARD P. ZENNER
BY *Curphey & Erickson*
PATENT AGENTS

United States Patent Office 3,378,915

Patented Apr. 23, 1968

3,378,915
METHOD OF MAKING A PLANAR DIFFUSED SEMICONDUCTOR VOLTAGE REFERENCE DIODE

Gerhard P. Zenner, Ottawa, Ontario, Canada, assignor to Northern Electric Company Limited, Montreal, Quebec, Canada Filed Mar. 31, 1966, Ser. No. 539,163
4 Claims. (Cl. 29—577)

Figure 1:
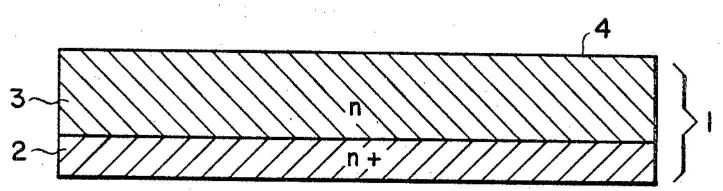

This invention relates to a method of making a planar diffused semiconductor voltage reference diode. A diffused semiconductor voltage reference diode is a semiconductor diode having a pn junction which is characterized by having an accurately controlled breakdown voltage. Such diodes are sometimes referred to as Zener diodes or as voltage limiters and find their widest application in voltage regulators since the breakdown is very sharp and gives a constant voltage characteristic.

Semiconductor diodes manufactured by the planar method offer improved manufacturing yields and enhanced characteristics over diodes made by other techniques. In a planar diode, the pn junction area at a plane surface of the diode is limited during fabrication by the use of a grown oxide layer or coating on the surface during diffusion of the junction. This nonconducting coating is left on the finished diode to protect the junction, where it reaches the semiconductor surface, from contamination and damage during fabrication and for the subsequent life of the diode.

Semiconductor voltage reference diodes are usually specified to have a certain voltage breakdown tolerance. This tolerance is dependent on the diffusion cycle (time and temperature of diffusion) during the formation of the pn junction, and on the resistivity of the semiconductor body into which the junction is diffused. Since this resistivity is the most significant parameter in determining the breakdown voltage of a diode, it is evident that it has to be accurately controlled. For example, in a voltage reference diode having a breakdown voltage tolerance of $\pm5\%$, the resistivity of the semiconductor body into which the pn junction is diffused has to be controlled to a tolerance of approximately $\pm10\%$.

It is known that the voltage breakdown of a planar diffused semiconductor voltage reference diode initially occurs at or near the region where the pn junction meets the surface underneath the oxide coating. Thus, it is of utmost importance that the resistivity at this surface be accurately controlled.

Prior to my invention, the resistivity of the semiconductor body was controlled by doping the semiconductor crystal with an impurity during its growth, and accurately controlled resistivities could be produced in the semiconductor crystal by such modern techniques as gas-phase doping. However, each time a diode having a different breakdown voltage was to be made, a semiconductor body having a different, but still accurately controlled resistivity, had to be produced. This tended to increase the cost of diode fabrication for a manufacturer making a line of diodes having different breakdown voltages.

Furthermore, not all semiconductor materials that are useful in making planar diffused diodes are capable of having their resistivities accurately controlled during their preparation. For example, epitaxial material could not be used, prior to my invention, since the control and variation of resistivity of this material is far more difficult to achieve than with single crystal slices. Yet, the use of epitaxial material would result in the advantages of obtaining small forward and reverse breakdown impedances as well as the elimination of some process steps such as a back diffusion for applying ohmic contacts.

I have invented a method for making planar diffused semiconductor voltage reference diodes having accurately controlled voltage breakdown tolerances, and which advantageously permits a wider choice of starting semiconductor material than permissible under known techniques.

According to my invention, I first prepare a semiconductor body having a specific resistivity at one plane surface of the body higher than that required for a predetermined breakdown voltage. I then diffuse an impurity into the surface of the semiconductor body to form a layer of the same conductivity type over the body. This layer is characterized by having a specific resistivity at the surface of the body lower than that required for the predetermined breakdown voltage. An oxide coating is then formed on the surface over this layer and an impurity is diffused into an aperture opened in the coating to the surface to form a pn junction. This diffusion step is performed at a controlled diffusion cycle so that the original layer diffuses further into the body until its specific resistivity at the surface is substantially that required for the predetermined breakdown voltage.

By controlling the resistivity by diffusion techniques during the fabrication of the diode rather than by attempting to accurately control the specific resistivity of the starting semiconductor body, a wider choice of starting material is now available for fabricating diodes of different breakdown voltages. This is because the breakdown voltage is now independent of the specific resistivity of the starting semiconductor body which only has to be higher than that needed to achieve a predetermined breakdown voltage.

This advantageously permits the use of epitaxial material because accurate control of the resistivity of this material is no longer a requirement.

My invention also permits voltage reference diodes to be incorporated into integrated microcircuits. Previously, the breakdown voltage of the emitter-base junction of a transistor was used for this purpose. However, since this breakdown voltage is only about 6 volts, two or three such transistor junctions had to be connected in series when there was a requirement for a higher breakdown voltage. A reference voltage diode made by standard techniques was not feasible for incorporation into an integrated microcircuit because the substrate material used in the fabrication of an integrated microcircuit is primarily intended to serve as the collector region of a transistor and therefore, has too high a resistivity for use as the body of a reference diode. Using the techniques of my invention, the reference diode can be readily fabricated on a discrete portion of integrated microcircuit substrate using well-known masking techniques to protect other devices in the circuit.

The invention will now be described, by way of example, with reference to the accompanying drawing in which:

FIGURES 1 to 5 schematically illustrate various steps in the fabrication of a planar diffused semiconductor voltage reference diode according to my invention.

The invention will be specifically described with respect to the fabrication of a p-n silicon diode, it being understood the invention is equally applicable to the fabrication of an n-p silicon diode and both types of germanium diodes.

Referring to the drawing, FIGURE 1 shows a silicon semiconductor body 1 of $n$ conductivity type preferably formed by depositing on a surface of a low resistivity $n+$ conductivity type silicon substrate 2, and $n$ conductivity type epitaxial layer 3 having a specific resistivity at its surface 4 higher than that required for a predetermined breakdown voltage. It is to be understood that semiconductor body 1 can be a single crystal of silicon suitably doped with an impurity during its growth.

Figure 2:
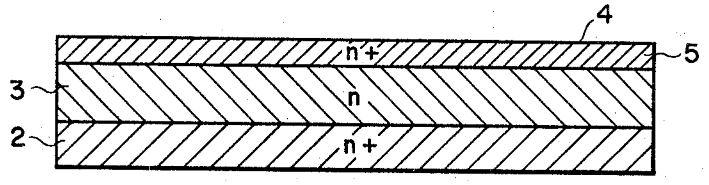
Figure 3:
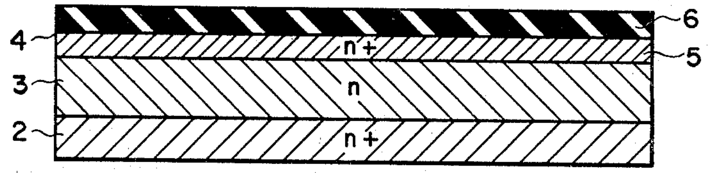

As shown in FIGURE 2, an impurity is then diffused into the surface 4 to form an $n+$ conductivity type layer 5 which extends from the surface 4 into the body 1. The layer 5 is characterized by having a specific resistivity at the surface 4 lower than that required for the predetermined breakdown voltage.

A silicon oxide coating 6 (FIGURE 3) is then formed on the surface 4 over the layer 5. This can be done by the well-known technique of thermally growing silicon dioxide on the surface 4.

Figure 4:
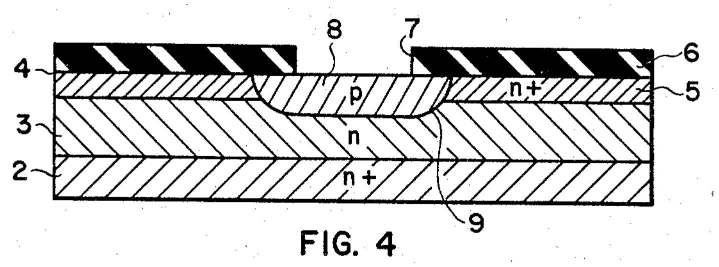
Figure 5:
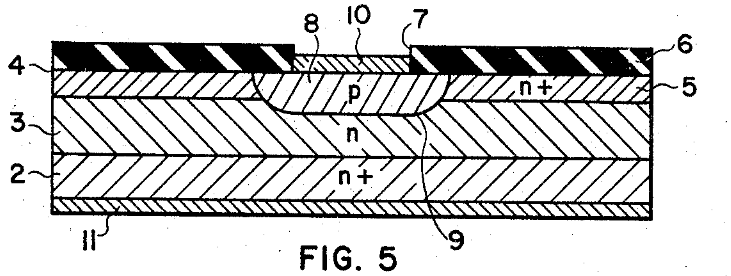

As shown in FIGURE 4, an aperture 7 is opened in the coating 6 to expose the surface 4 and an impurity is diffused from this surface 4 to form a $p$ conductivity type zone 8 which defines a pn junction 9 with the epitaxial layer 3 and the layer 5. In practice, the junction 9 may not necessarily extend into the layer 3 but may define the pn junction only with the layer 5.

The diffusion of the zone 8 is performed at a controlled diffusion cycle (i.e., temperature and time) such that the layer 5 will diffuse further into the layer 3 until the specific resistivity of the layer 5 at the surface 4 is substantially that required for the predetermined breakdown voltage.

The diode is completed (FIGURE 5) by applying ohmic contacts 10 and 11 to the surface of zone 8 and the substrate 2 respectively. Alternatively, the contact 11 could be applied to the surface 4 of the layer 5 by forming another aperture in the oxide coating 6.

By suitable choice of the impurity used for diffusing the layers, surface resistivities over a considerable range can be achieved in a reproducible manner. Thus, the breakdown voltage for different diodes can be varied accordingly.

To obtain suitable power handling capabilities for the diodes, a suitable geometry for the periphery of the junction at the surface can be chosen.

As mentioned above, the use of epitaxial material results in small forward and reverse breakdown impedances thereby producing a very steep breakdown in the diodes. The low resistivity layer 2 is suitable for achieving a low ohmic contact 11 and eliminates the requirement for a further diffusion and masking step which was required in prior art techniques.

A p-n diode, according to my invention, has been successfully fabricated by first forming an $n$ conductivity type epitaxial layer having a specific resistivity of about 0.5 ohm-cm. onto an $n+$ substrate having a specific resistivity of about 0.01 ohm-cm. An $n+$ layer was formed on the surface of the epitaxial layer by diffusing the impurity phosphorous using the well known $POCl_3$ pre-deposition technique at a temperature of 750° C. for 30 minutes. This produced a specific resistivity at the surface of the $n+$ layer of about 0.04 ohm-cm.

A silicon dioxide layer was then thermally grown on the surface over the $n+$ layer and the aperture opened in the coating by well-known techniques.

The pn junction was then formed by a pre-depositing boron in the aperture 7 followed by diffusion at 1200° C. for 150 minutes. Gold was then evaporated to form the two ohmic contacts. This produced a voltage reference diode having a breakdown voltage of about 16 volts.

In a similar manner, an n-p diode has been fabricated. A $p$ conductivity type epitaxial layer having a specific resistivity of about 0.5 ohm-cm. was grown on a $p+$ substrate having a specific resistivity of about 0.01 ohm-cm. A $p+$ layer was formed on the surface of the epitaxial layer by diffusing the impurity boron by the well-known closed box pre-deposition technique at a temperature of 850° C. for 30 minutes. This produced a specific resistivity at the surface of the $p+$ layer of about 0.02 ohm-cm.

The oxide layer and aperture were formed as described above and the pn junction was then formed by pre-depositing phosphorous in the aperture followed by diffusion at 1200° C for 120 minutes. Gold was then evaporated to form the two ohmic contacts. This produced a voltage reference diode having a breakdown voltage of about 24 volts.

Thus, I have described a method of making planar diffused semiconductor voltage reference diodes having accurately controlled breakdown voltages. A wider choice of starting semiconductor materials is permitted including the advantageous use of epitaxial material. In addition, the diodes can be readily incorporated into integrated microcircuits.

What is claimed is:

1. A method of making a planar diffused semiconductor voltage reference diode comprising the steps of:

(a) preparing a semiconductor body of one conductivity type having two opposing plane surfaces, said body being characterized by having a specific resistivity at one of said surfaces higher than that required for a predetermined breakdown voltage;

(b) diffusing an impurity from said one surface into said body to form a layer of said one conductivity type extending from said one surface into said body, the layer being characterized by having a specific resistivity at said one surface lower than that required for said predetermined breakdown voltage;

(c) forming an oxide coating on said surface over said layer;

(d) diffusing an impurity from said one surface through an aperture opened in said coating to said surface, to form a zone of opposite conductivity type, said zone defining a pn junction with at least said layer of one conductivity type, with said junction extending to said one surface underneath said coating about said zone;

(e) said latter diffusion step being performed at a controlled diffusion cycle such that said layer diffuses further into said body until the specific resistivity of said layer at said surface is substantially that required for said predetermined breakdown voltage;

(f) and forming ohmic contacts to said zone on said one surface and to said body of one conductivity type on one or the other of said surfaces.

2. A method as defined in claim 1 wherein the diode is incorporated into an integrated microcircuit.

3. A method as defined in claim 1 wherein said body is prepared by depositing on a surface of a semiconductor substrate of said one conductivity type an epitaxial layer of higher specific resistivity than said substrate, the surface of the epitaxial layer serving as said one surface of said body and the other surface of said substrate serving as the opposite surface of said body, the ohmic contact formed to said body being made to said other surface of said substrate.

4. A method as defined in claim 3 wherein the diode is incorporated into an integrated microcircuit.

References Cited

UNITED STATES PATENTS 3,150,021 9/1964 Sato ---------------- 29—574 X 3,345,221 10/1967 Lesk ---------------- 148—175

WILLIAM I. BROOKS, *Primary Examiner.*